(12) United States Patent
Liu et al.

(10) Patent No.: US 12,107,203 B2
(45) Date of Patent: Oct. 1, 2024

(54) LIGHT-EMITTING SUBSTRATE AND DISPLAY DEVICE

(71) Applicant: BOE Technology Group Co., Ltd., Beijing (CN)

(72) Inventors: Song Liu, Beijing (CN); Zhengliang Li, Beijing (CN); Kun Zhao, Beijing (CN); Feifei Li, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 489 days.

(21) Appl. No.: 17/465,689

(22) Filed: Sep. 2, 2021

(65) Prior Publication Data

US 2022/0223773 A1    Jul. 14, 2022

(30) Foreign Application Priority Data

Jan. 13, 2021    (CN) .......................... 202110042527.0

(51) Int. Cl.
*H01L 33/62* (2010.01)
*H01L 25/075* (2006.01)
*H01L 33/56* (2010.01)

(52) U.S. Cl.
CPC .......... *H01L 33/62* (2013.01); *H01L 25/0753* (2013.01); *H01L 33/56* (2013.01)

(58) Field of Classification Search
CPC ................. H01L 33/62; H01L 25/0753; H01L 23/53228; H01L 23/53233; H01L 23/53238; H01L 33/00–648; H01L 27/15–156; H01L 2933/00–0091; H01L 33/483–486; H01L 2933/0033; H01L 2933/0025; H01L 33/50–508; H01L 2933/0041; H01L 33/44; H01L 33/52–56; H01L 2933/005; H01L 33/54; H01L 33/58–60; H01L 2933/0058; H01L 33/64–648; H01L 2933/0075; H01L 2933/0083; H01L 33/22; H01L 33/20; H01L 51/5262

See application file for complete search history.

(56) References Cited

U.S. PATENT DOCUMENTS

2015/0315693 A1* 11/2015 Seals ................... C23C 18/1241
                                                         427/446
2019/0373723 A1* 12/2019 Tsai ........................ H05K 1/11

* cited by examiner

*Primary Examiner* — Mohammad A Rahman
(74) *Attorney, Agent, or Firm* — IPro, PLLC

(57) ABSTRACT

Disclosed are a light-emitting substrate and a display device. In the light-emitting substrate, a first pad of a light-emitting area includes a first metal layer located above a base substrate and a second metal layer located on a side, facing away from the base substrate, of the first metal layer. A material of the second metal layer includes copper-nickel-titanium alloy, and a quantity of nickel atoms and/or titanium atoms contained per unit area in a cross section, farther from the base substrate, of the second metal layer is greater than a quantity of nickel atoms and/or titanium atoms contained per unit area in another cross section, closer to the base substrate, of the second metal layer.

20 Claims, 3 Drawing Sheets

LIGHT-EMITTING SUBSTRATE AND DISPLAY DEVICE

CROSS-REFERENCE TO RELATED APPLICATIONS

This disclosure claims priority to Chinese Patent Application No. 202110042527.0, filed with the China National Intellectual Property Administration on Jan. 13, 2021, the content of which is hereby incorporated by reference in its entirety.

FIELD

The present disclosure relates to the technical field of display, and particularly to a light-emitting substrate and a display device.

BACKGROUND

Mini/Micro LED lighting substrates have high demands on the resistance of metal wires, so copper metal is commonly used as a wire material. During fabrication of a light-emitting substrate, bonding of a Mini/Micro LED and bonding of a flexible printed circuit board or integrated circuit need to be separately performed.

SUMMARY

Embodiments of the present disclosure provide a light-emitting substrate and a display device.

Embodiments of the present disclosure provide a light-emitting substrate, including a base substrate, where the base substrate is provided with a light-emitting area, the light-emitting area includes a plurality of first pads located above the base substrate, and the plurality of first pads are used for being in bonding connection to a plurality of light-emitting units; any one of the plurality of first pads includes a first metal layer located above the base substrate, and a second metal layer located on a side, facing away from the base substrate, of the first metal layer; a material of the first metal layer includes copper, and a material of the second metal layer includes copper-nickel-titanium alloy; in at least two cross sections, parallel to a plane where the base substrate is located, of the second metal layer, a quantity of nickel atoms contained per unit area in a cross section farther from the base substrate is greater than a quantity of nickel atoms contained per unit area in another cross section closer to the base substrate; and/or a quantity of titanium atoms contained per unit area in the cross section farther from the base substrate is greater than a quantity of titanium atoms contained per unit area in the another cross section closer to the base substrate.

Embodiments of the present disclosure provide a display device including the light-emitting substrate provided by embodiments of the present disclosure.

DETAILED DESCRIPTION

Figure 1:
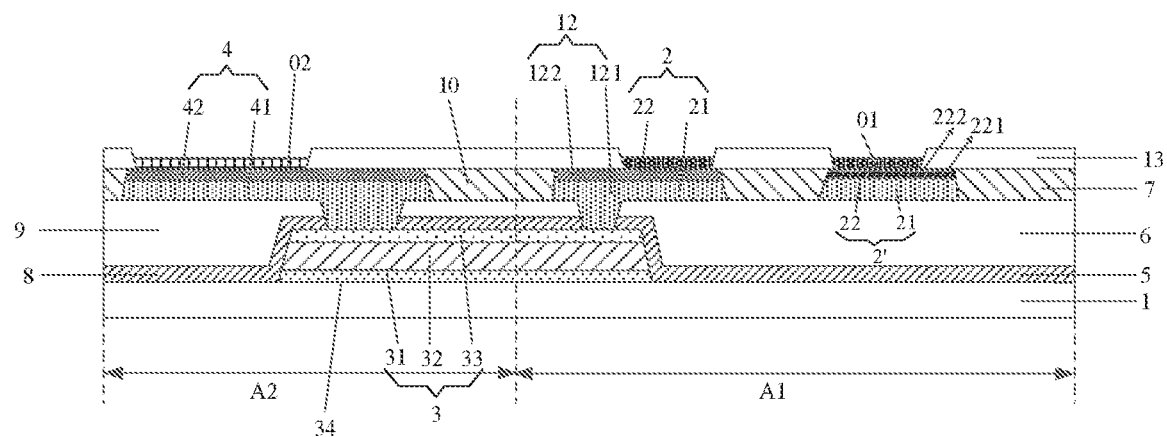
FIG. 1 is a schematic cross-sectional view taken along the AA' direction of FIG. 2.

In order to make the objectives, technical solutions and advantages of the present disclosure clearer, the implementations of a light-emitting substrate and a fabrication method thereof, a light-emitting device of the light-emitting substrate, and related apparatuses provided by embodiments of the present disclosure will be described in detail in conjunction with the accompanying drawings.

The thickness and shape of each film layer in the figures do not reflect the true proportion of the light-emitting substrate, and the purpose is only to illustrate the present disclosure schematically.

A Mini-LED (sub-millimeter light-emitting diode) refers to a light-emitting diode with a size in a range of 80 μm to 300 μm. When the Mini-LED is used as pixels of the display panel to form a self-luminous display, the Mini-LED can achieve a higher pixel density than a small-spacing LED display. When the Mini-LED is used as a light source to be applied in a backlight module, an ultra-thin light source module can be made through denser arrangement of light sources; combined with regional dimming technology, the display screen including the Mini-LED backlight module may have better contrast ratio and high dynamic lighting rendering display effect. Micro LEDs with a size less than 80 μm can be directly used as pixels for display panels such as near-eye, wearable or handheld terminals.

The light-emitting substrate provided by the present disclosure may refer to a substrate used for providing a light source, or may refer to a substrate used for display, which is not limited herein.

In the related art, in order to complete the bonding of the Mini/Micro LED and the light-emitting substrate, it is necessary to place solder paste on the pad, to be electrically connected to the Mini/Micro LED, on the light-emitting substrate, then transfer the Mini/Micro LED to the corresponding position on the light-emitting substrate, and then complete the fixing of the Mini/Micro LED and the light-emitting substrate by reflow soldering in a temperature range of 230° C. to 260° C. Bonding of the circuit board to the pad, to be electrically connected to the circuit board, on the light-emitting substrate is achieved by hot pressing in a temperature range of 130° C. to 150° C.

Since the bonding of the Mini/Micro LED and the circuit board to the light-emitting substrate requires different process conditions, the bonding of the Mini/Micro LED and the bonding of the circuit board cannot be realized simultaneously. Therefore, for example, in the case of bonding the Mini/Micro LED first, the pad material, to be bonded to the circuit board, on the light-emitting substrate is extremely prone to oxidation under the process conditions corresponding to the bonding of the Mini/Micro LED, which makes it impossible to ensure that the circuit board can achieve good electrical connection with the light-emitting substrate, thereby reducing the product yield. It is understandable that if the light-emitting substrate is first bonded to the circuit board and then bonded to the Mini/Micro LED, the same problem will also exist.

Embodiments of the present disclosure provide a light-emitting substrate, which can be configured to display or provide backlight. As shown in FIG. 1, the light-emitting substrate includes a base substrate 1, where the base substrate 1 is provided with a light-emitting area A1, the light-emitting area A1 includes a plurality of first pads (2 and 2') located above the base substrate 1, and the plurality of first pads (2 and 2') are used for being in bonding connection to a plurality of light-emitting units (not shown in FIG. 1).

Any one of the plurality of first pads (2 and 2') includes: a first metal layer 21 located above the base substrate 1, and a second metal layer 22 located on a side, facing away from the base substrate 1, of the first metal layer 21.

A material of the first metal layer 21 includes copper, and a material of the second metal layer 22 includes copper-nickel-titanium alloy (CuNiTi).

In at least two cross sections (for example, a cross section 221 and a cross section 222), parallel to the plane where the base substrate 1 is located, of the second metal layer 22, a quantity of nickel atoms contained per unit area in the cross section 222 farther from the base substrate 1 is greater than a quantity of nickel atoms contained per unit area in the cross section 221 closer to the base substrate 1; and/or, a quantity of titanium atoms contained per unit area in the cross section 222 farther from the base substrate 1 is greater than a quantity of titanium atoms contained per unit area in the cross section 221 closer to the base substrate 1.

In the light-emitting substrate provided by an embodiment of the present disclosure, the first pad of the light-emitting area A1 includes the first metal layer 21 located above the base substrate 1 and the second metal layer 22 located on the side, facing away from the base substrate 1, of the first metal layer 21, and the material of the second metal layer 22 includes copper-nickel-titanium alloy. Because nickel and titanium have stronger oxidation resistance, an embodiment of the present disclosure adopts the design that in the second metal layer 22, the quantity of nickel atoms and/or titanium atoms contained per unit area in a cross section (for example, the cross section 222) farther from the base substrate 1 is greater than the quantity of nickel atoms and/or titanium atoms contained per unit area in another cross section (for example, the cross section 221) closer to the base substrate 1, so that the quantity of nickel atoms and/or titanium atoms in the surface, far away from the base substrate 1, of the second metal layer 22 is greater, the surface of the second metal layer 22 has oxidation resistance, and therefore, the problem of oxidation in the process of fabricating the light-emitting substrate can be avoided. Therefore, the second metal layer 22 can protect the first metal layer 21 and prevent the first metal layer 21 from being oxidized during the process of fabricating the light-emitting substrate.

The light-emitting substrate provided by an embodiment of the present disclosure may be a display substrate or may be a backlight substrate. If the light-emitting substrate is the display substrate, the light-emitting area A1 constitutes a display area, and the light-emitting unit is a sub-pixel, thereby realizing display of pictures. If the light-emitting substrate is the backlight substrate, the light-emitting area A1 is used to provide a light source to cooperate with a passive display panel to achieve display.

Here, the light-emitting color of the light-emitting area included in the light-emitting substrate is not limited, the light-emitting area may be any one of a red light-emitting area, a green light-emitting area or a blue light-emitting area. The light-emitting substrate may simultaneously include light-emitting areas having three light-emitting colors, i.e. red light-emitting areas, green light-emitting areas and blue light-emitting areas at the same time; of course, the light-emitting substrate may also only include light-emitting areas having one light-emitting color, for example: only include a plurality of red light-emitting areas, only include a plurality of green light-emitting areas, or only include a plurality of blue light-emitting areas, which can be determined according to actual requirements.

The control method for the plurality of light-emitting areas is not limited. For example, each light-emitting area can be controlled independently, or a plurality of light-emitting areas can be controlled at the same time.

In some embodiments, the base substrate may be made of a rigid material, such as glass, or the base substrate may be made of a flexible material, such as polyimide.

In some embodiments, in the above-mentioned light-emitting substrate provided by embodiments of the present disclosure, as shown in FIG. 1, the second metal layer 22 mainly plays a role in protecting the first metal layer 21, so the thickness of the second metal layer 22 cannot be too thick to avoid the situation that the pattern shape cannot be guaranteed due to the increase of etching difficulty, and the thickness of the second metal layer 22 cannot be too thin, otherwise the oxidation resistance may be poor. Therefore, considering the two factors of process realization and oxidation resistance, an embodiment of the present disclosure sets the thickness of the second metal layer 22 to be in a range of 30 nm to 100 nm, and the thickness of the first metal layer 21 is approximately in the range of several thousand of angstroms.

In some embodiments, in order to ensure the conductivity and low resistance of the second metal layer, the content of Cu contained in the second metal layer is required to be relatively high. Therefore, in the light-emitting substrate provided by an embodiment of the present disclosure, as shown in FIG. 1, in the material of the second metal layer 22, a mass fraction of Cu accounts for a range of 90% to 95%, a mass fraction of Ni accounts for a range of 4.5% to 9%, and a mass fraction of Ti accounts for a range of 0.5% to 1%. The inventor found through tests that when the mass fraction of Ni accounts for the range of 4.5% to 9% and the mass fraction of Ti accounts for the range of 4.5% to 1%, the second metal layer 22 has better oxidation resistance.

In some embodiments, in the above-mentioned light-emitting substrate provided by an embodiment of the present disclosure, as shown in FIG. 1, the material of the second metal layer 22 may contain some impurities. For example, the material of the second metal layer 22 may also include Si, or C or O, where a mass fraction of any one of Si, C and O is less than 0.1%.

In some embodiments, in the above-mentioned light-emitting substrate provided by an embodiment of the present disclosure, as shown in FIG. 1, the base substrate 1 is further provided with a bonding area A2, where the bonding area A2 includes a plurality of second pads 4 located above the base substrate 1, and the plurality of second pads 4 are used for being bonding connection to a circuit board (not shown in FIG. 1); any one of the plurality of second pads 4 includes: a third metal layer 41 located above the base substrate 1, and a fourth metal layer 42 located on a side, facing away from the base substrate 1, of the third metal layer 41.

The third metal layer 41 and the first metal layer 21 are arranged on the same layer, and the fourth metal layer 42 and the second metal layer 22 are arranged on the same layer. "being arranged on the same layer" refers to being fabricated by one-time patterning process. The one-time patterning process refers to forming the required pattern through one-time film forming and photolithography processes. The one-time patterning process includes processes such as film formation, exposure, development, etching and stripping. The third metal layer 41 and the first metal layer 21 are arranged on the same layer, and the fourth metal layer 42 and the second metal layer 22 are arranged on the same layer, thereby reducing the number of patterning processes, simplifying the fabrication process, and greatly reducing production costs. In addition, since the second metal layer 22 has oxidation resistance, the surface of the fourth metal layer 42 also has oxidation resistance. Therefore, during the fabrication process of the light-emitting substrate, the fourth metal layer 42 of the bonding area will not be oxidized, so that the problem of oxidation during the process of fabricating the light-emitting substrate can be avoided. Therefore, the fourth metal layer 42 can play a role in protecting the third metal layer 41 for preventing the third metal layer 41 from being oxidized during the process of fabricating the light-emitting substrate.

In some embodiments, the above-mentioned light-emitting substrate provided by an embodiment of the present disclosure, as shown in FIG. 1, further includes a first wire layer 3 located between the first pads (2 and 2') and the base substrate 1. The first wire layer 3 includes a first metal sub-layer 31, a first wire sub-layer 32 and a second metal sub-layer 33 that are stacked; the first metal layer 21 and the second metal sub-layer 33 are electrically connected, and the third metal layer 41 and the second metal sub-layer 33 are electrically connected for transmitting electrical signals provided by the circuit board.

A material of the first metal sub-layer 31 and the second metal sub-layer 33 includes molybdenum-niobium alloy. The molybdenum-niobium alloy has adhesivity and thus can enhance the adhesion between the first wire layer 3 and the base substrate 1. In some cases, in order to prevent the base substrate from being subjected to excessive stress to generate fragments caused by the excessive overall area of the first wire layer 3, a buffer layer may be arranged between the base substrate 1 and the first wire layer 3 to relieve stress. In addition, the first metal sub-layer 31 made of molybdenum-niobium alloy can also enhance the adhesion between the first wire layer 3 and the buffer layer. The material of the buffer layer is, for example, silicon nitride. At the same time, the second metal sub-layer 33 made of molybdenum-niobium alloy is connected to the first pad. Due to the adhesivity of the molybdenum-niobium alloy, it can be ensured that the first wire layer 3 and the first pad are firmly connected, and the molybdenum-niobium alloy has conductivity, so that the conductivity between the first pad and the first wire layer 3 can be ensured. In addition, the second metal sub-layer 33 made of molybdenum-niobium alloy can protect the copper in the first wire sub-layer 32 from oxidation. The material of the first wire sub-layer 32 may include copper which has good conductivity and can ensure electrical connection between film layers. The low resistance of copper can reduce current loss during operation. The low price of copper can reduce the fabrication cost of the light-emitting substrate.

In some embodiments, as shown in FIG. 1, the second pad 4 only including the third metal layer 41 and the fourth metal layer 42 is taken as an example. Of course, the second pad 4 can also only include the film layer arranged on the same layer as the first wire layer 3, or the second pad 4 includes the film layer arranged on the same layer as the first wire layer 3 and the third metal layer 41 and the fourth metal layer 42 at the same time.

In some embodiments, in the above-mentioned light-emitting substrate provided by an embodiment of the present disclosure, as shown in FIG. 1, the light-emitting area A1 further includes: a first passivation layer 5 located between the first wire layer 3 and the first metal layer 21, a first planarization layer 6 located between the first passivation layer 5 and the first metal layer 21, a second planarization layer 7 located on a side, facing away from the base substrate 1, of the second metal layer 22, and a first connection portion 01 located on the second metal layer 22, where the second planarization layer 7 covers an area between the plurality of first pads (2 and 2').

The first wire layer 3 may include an anode wire 34 and a cathode wire 35 (not shown in FIG. 1), that is, both the anode wire 34 and the cathode wire 35 adopt the stacking mode in which the first metal sub-layer 31, the first wire sub-layer 32 and the second metal sub-layer 33 are arranged. In order to reduce the voltage drop (IR Drop), a thickness of the first wire sub-layer 32 may be in a range of 1 μm to 7 μm. For example, the thickness of the first wire sub-layer 32 is related to the product size of the Mini-LED back plate, theoretically, the larger the size, the greater the thickness required. The first metal sub-layer 31, the first wire sub-layer 32 and the second metal sub-layer 33 can be fabricated in sequence by using a sputtering process. The second metal sub-layer 33 can protect the first wire sub-layer 32 and prevent the surface of the first wire sub-layer 32 from being oxidized. The thickness of the first metal sub-layer 31 and the second metal sub-layer 33 is approximately in the range of several hundred angstroms.

In some embodiments, as shown in FIG. 1, the first passivation layer 5 covers the gap area between the anode wire 34 and the cathode wire 35, and separates adjacent wires to avoid wrong electric connection of adjacent wires. The material of the first passivation layer 5 may be silicon nitride, silicon oxide, silicon oxynitride, etc. The first planarization layer 6 covers the area between the anode wire 34 and the cathode wire 35. The first planarization layer 6 may be an organic film, is used to fill the gap area between the wires, avoid large step differences in subsequent processes, and ensure that the light-emitting unit does not displace when the light-emitting unit is bonded, thereby improving the flatness of the light-emitting substrate and increasing the reflectivity of the light-emitting substrate; at the same time, the first planarization layer 6 can also play an insulating role.

In some embodiments, as shown in FIG. 1, the material of the first connection portion 01 on the second metal layer 22 may be solder paste, copper paste, or the like.

In some embodiments, in the above-mentioned light-emitting substrate provided by embodiments of the present disclosure, as shown in FIG. 1, the bonding area A2 further includes: a second passivation layer 8 located between the first wire layer 3 and the third metal layer 41, a third planarization layer 9 located between the second passivation layer 8 and the third metal layer 41, a fourth planarization layer 10 located on a side, facing away from the base substrate 1, of the fourth metal layer 42, and a second connection portion 02 located on the fourth metal layer 42; the fourth planarization layer 10 covers an area between the plurality of second pads 4.

The third planarization layer 9 and the first planarization layer 6 are arranged on a same layer, can form an integrated structure, and may be made of an organic material, such as resin, for planarizing to facilitate subsequent processes; the fourth planarization layer 10 and the second planarization layer 7 are arranged on a same layer, can form an integrated structure, and may be made of an organic material, such as resin, for planarization to facilitate subsequent processes; the second passivation layer 8 and the first passivation layer 5 are arranged on a same layer, can form an integrated structure, and may be made of silicon oxynitride, silicon nitride, or the like.

In some embodiments, as shown in FIG. 1, a material of the second connection portion 02 on the fourth metal layer 42 may be thermosetting glue.

Figure 2:
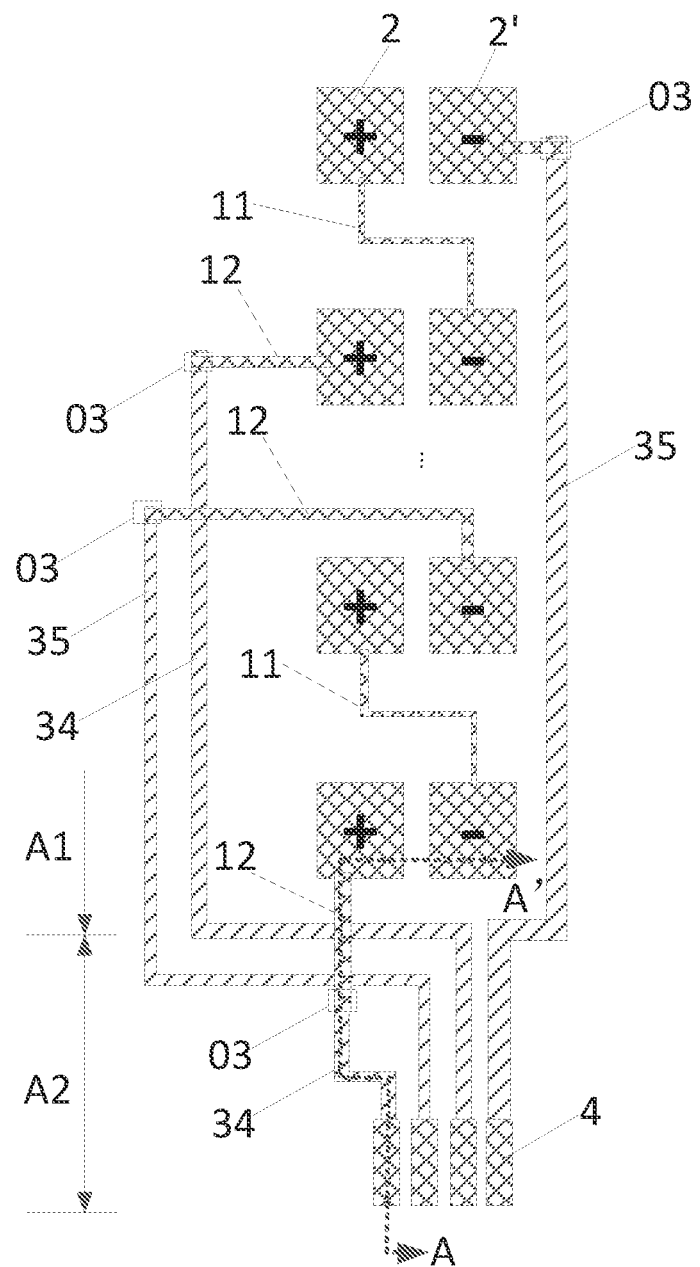
FIG. 2 is a structural schematic top view of a light-emitting substrate provided by an embodiment of the disclosure.

In some embodiments, in the above-mentioned light-emitting substrate provided by an embodiment of the present disclosure, as shown in FIG. 2, the plurality of first pads (2 and 2') are divided into a plurality of groups of first pads, and each group of first pads includes a cathode pad 2' and an anode pad 2 that are arranged in pairs.

The light-emitting substrate also includes a second wire layer arranged on a same layer as the plurality of first pads (2 and 2'). The second wire layer is used for realizing series connection or parallel connection of the plurality of groups of first pads and is also electrically connected to the first wire layer 3 through a via hole penetrating the first planarization layer 6 and the first passivation layer 5.

In some embodiments, as shown in FIGS. 1 and 2, FIG. 1 is a schematic cross-sectional view along the AA' direction of FIG. 2, and the second wire layer includes wires 11 and wires 12. As shown in FIG. 1, the wire 12 may include a fifth metal layer 121 and a sixth metal layer 122. The fifth metal layer 121 is electrically connected to the first metal layer 21, and the sixth metal layer 122 is electrically connected to the second metal layer 22, which are separated by dotted lines in FIG. 1. That is, the material of the fifth metal layer 121 includes copper, and the material of the sixth metal layer 122 includes copper-nickel-titanium alloy.

Of course, in some embodiments, the wire 12 in FIG. 1 may also be only provided with the fifth metal layer 121, that is, the sixth metal layer 122 in FIG. 1 is removed.

Figure 3:
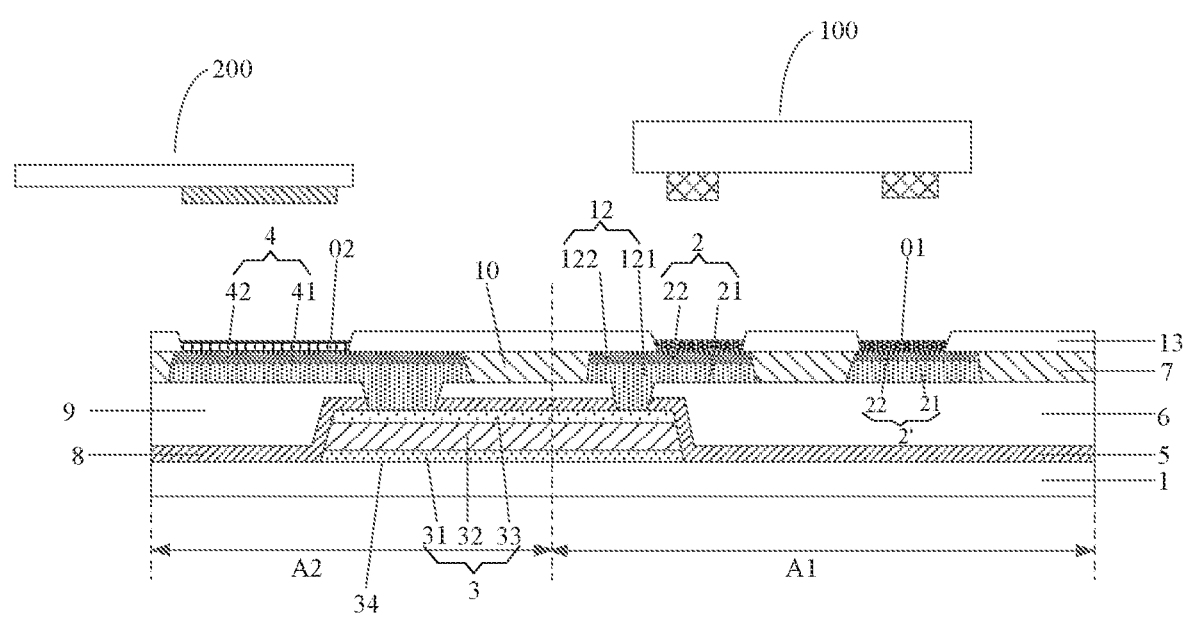
FIG. 3 is another schematic cross-sectional view taken along the AA direction of FIG. 2.

In some embodiments, the above-mentioned light-emitting substrate provided by embodiments of the present disclosure, as shown in FIG. 3, may further include a plurality of light-emitting units, and each light-emitting unit may include a light-emitting diode 100 shown in FIG. 3. It should be noted that since the light-emitting diode 100 includes an anode and a cathode, bonding of one light-emitting diode 100 needs two first pads. The above-mentioned plurality of first pads may be divided into a plurality of groups of first pads, each group of first pads is used to bind one light-emitting diode, and includes a cathode pad and an anode pad that are arranged in pairs, where the first pad bonded to the cathode of the light-emitting diode is called the cathode pad, and the first pad bonded to the anode of the light-emitting diode is called the anode pad. The light-emitting diode 100 is bonded to the cathode pad and the anode pad through the first connection portion 01 (solder paste or copper paste). In the figures of embodiments of the present disclosure, in order to clearly distinguish the cathode pad from the anode pad, different signs are adopted for description. For example, referring to FIGS. 2 and 3, the cathode pad is marked as 2', and the anode pad is marked as 2, but the film layers included in the cathode pad and the anode pad have the same structure.

The connection method of the plurality of groups of first pads is not limited. FIG. 2 takes two adjacent groups of first pads being connected in series as an example for illustration. As shown in FIG. 2, the area A2 is the bonding area, and the area A1 is the light-emitting area. The plurality of first pads (2 and 2') can be divided into a plurality of groups of first pads, and each group of first pads is used for bonding one light-emitting diode and includes a cathode pad 2' and an anode pad 2 that are arranged in pairs. The first wire layer 3 may include an anode wire 34 and a cathode wire 35. Two adjacent groups of first pads are connected in series through the wire 11; as shown in FIGS. 1 and 2, in the two groups of first pads connected in series, the anode pad 2 in one group is connected to one wire 12 which is electrically connected to the anode wire 34 through a via hole 03 penetrating the first passivation layer 5 and the first planarization layer 6; the anode wire 34 is electrically connected to one second pad 4 through a via hole (not shown in FIG. 1) penetrating the first passivation layer 5 and the first planarization layer 6; the cathode pad in the other group is connected to another wire 12 which is electrically connected to the cathode wire 35 through a via hole 03 penetrating the first passivation layer 5 and the first planarization layer 6, and the cathode wire 35 is electrically connected to another second pad 4 through a via hole (not shown in FIG. 1) penetrating the first passivation layer 5 and the first planarization layer 6. In FIG. 2, the cathode pad 2', the anode pad 2, the second pad 4, the wire 11 and the wire 12 are arranged on the same layer, and the same filling pattern is used to indicate the cathode pad 2', the anode pad 2, the second pad 4, the wire 11 and the wire 12; the anode wire 34 and the cathode wire 35 are arranged on the same layer, and the same filling pattern is used to indicate the anode wire 34 and the cathode wire 35.

In some embodiments, the above-mentioned light-emitting substrate provided by embodiments of the present disclosure, as shown in FIG. 3, may further include a circuit board 200, and the circuit board 200 is in bonding connection to the second pad 4 through the second connection portion 02 (thermosetting glue).

It is understandable that the present disclosure does not limit the driving method of the light-emitting substrate. As shown in FIG. 2, the light-emitting substrate can drive the light-emitting unit in a passive manner, or a signal may also be provide to the light-emitting unit through a driving circuit including a thin film transistor. Or, it is also possible to provide a signal to the light-emitting unit through a microchip.

In some embodiments, when a signal is provided to the light-emitting unit through a microchip, the plurality of light-emitting units may be divided into plurality of light areas, each light area includes at least one light-emitting unit, and each microchip is used to drive the light-emitting units in at least one light area to emit light. Each microchip includes a plurality of pins, and the light-emitting substrate also includes a third pad located in the light-emitting area. The structure of the third pad is similar to that of the first pad, and can be fabricated using the same film layers as the first pad.

In some embodiments, the above-mentioned light-emitting substrate provided by an embodiment of the present disclosure, as shown in FIG. 1, may further include a protective layer 13 located on a side, facing away from the base substrate 1, of the first pads (2 and 2') and the second pads 4, where the protective layer 13 exposes the first pads (2 and 2') and the second pads 4, and a material of the protective layer 13 may include silicon nitride or silicon oxide.

In some embodiments, in the above-mentioned display device provided by embodiments of the present disclosure, the light-emitting unit may be a mini light-emitting diode (Mini LED for short), and also known as a sub-millimeter light-emitting diode, or a micro light-emitting diode (Micro LED for short).

When the light-emitting substrate provided by an embodiment of the present disclosure is used as the backlight source, the Mini LED backlight uses an extremely large number of ultra-small LED lamp groups to achieve the backlight effect. The size and pitch of the Mini LED are small, so that Mini LED backlight can not only make the quantity of local dimming zones more detailed, achieve high-dynamic range (HDR) and present high-contrast effects, but also shorten the optical distance (OD) to reduce the thickness of the whole machine to achieve thinner requirements. Micro LED is a new generation of display technology, which is LED miniaturization and matrix technology. Compared with Mini LED, the Micro LED has a smaller volume, that is, the Micro LED can further increase the quantity of local dimming zones and improve the contrast of a liquid crystal display.

Based on the same inventive concept, embodiments of the present disclosure also provide a display device, including: the above-mentioned light-emitting substrate provided by embodiments of the present disclosure, a circuit board, and a plurality of light-emitting units; the plurality of light-emitting units are electrically connected to the plurality of first pads of the light-emitting substrate, and the circuit board is electrically connected to the plurality of second pads of the light-emitting substrate.

The display device has the characteristics of high contrast, good brightness and high color reproduction. The display device may be a rigid display device or a flexible display device (that is, bendable and foldable). The display device may be any product or component with a display function, such as a mobile phone, a tablet computer, a television, a display, a notebook computer, a digital photo frame and a navigator. Other indispensable components of the display device are understood by those of ordinary skill in the art, and will not be repeated here, nor should they be used as a limitation to the present disclosure. The problem solving principle of the display device is similar to that of the aforementioned light-emitting substrate, therefore, the implementation of the display device can refer to the implementation of the aforementioned light-emitting substrate, and the repetitive parts will not be repeated here.

In the light-emitting substrate and the display device provided by embodiments of the present disclosure, the first pad of the light-emitting area includes the first metal layer located above the base substrate and the second metal layer located on the side, facing away from the base substrate, of the first metal layer, and the material of the second metal layer includes copper-nickel-titanium alloy. Because nickel and titanium have stronger oxidation resistance, an embodiment of the present disclosure adopts the design that the quantity of nickel atoms and/or titanium atoms contained per unit area in one cross section, farther from the base substrate, of the second metal layer is greater than the quantity of nickel atoms and/or titanium atoms contained per unit area in the other cross section, closer to the base substrate, of the second metal layer, so that the quantity of nickel atoms and/or titanium atoms in the surface, far away from the base substrate, of the second metal layer is greater, consequently, the surface of the second metal layer has oxidation resistance, and therefore, the second metal layer of the light-emitting area is free from oxidation in the process of fabricating the light-emitting substrate. Therefore, the second metal layer can play a role in protecting the first metal layer for preventing the first metal layer from being oxidized during the process of fabricating the light-emitting substrate.

Obviously, those skilled in the art can make various changes and variations to the present disclosure without departing from the spirit and scope of the present disclosure. In this way, if these modifications and variations of the present disclosure fall within the scope of the claims of the present disclosure and their equivalent technologies, the present disclosure is also intended to include these changes and variations.

What is claimed is:

1. A light-emitting substrate, comprising a base substrate, wherein the base substrate is provided with a light-emitting area, the light-emitting area comprises a plurality of first pads located above the base substrate, the plurality of first pads are configured to be in bonding connection to a plurality of light-emitting units;
   any one of the plurality of first pads comprises: a first metal layer located above the base substrate, and a second metal layer located on a side, facing away from the base substrate, of the first metal layer;
   a material of the first metal layer comprises copper, and a material of the second metal layer comprises copper-nickel-titanium alloy;
   in at least two cross sections, parallel to a plane where the base substrate is located, of the second metal layer, a quantity of nickel atoms contained per unit area in a cross section farther from the base substrate is greater than a quantity of nickel atoms contained per unit area in another cross section closer to the base substrate; and/or, a quantity of titanium atoms contained per unit area in the cross section farther from the base substrate is greater than a quantity of titanium atoms contained per unit area in the another cross section closer to the base substrate.

2. The light-emitting substrate according to claim 1, wherein a thickness of the second metal layer is in a range of 30 nm to 100 nm.

3. The light-emitting substrate according to claim 1, wherein, in the material of the second metal layer, a mass fraction of Cu accounts for a range of 90% to 95%, a mass fraction of Ni accounts for a range of 4.5% to 9%, and a mass fraction of Ti accounts for a range of 0.5% to 1%.

4. The light-emitting substrate according to claim 3, wherein the material of the second metal layer further comprises Si or C or O, and a mass fraction of any one of Si, C and O is less than 0.1%.

5. The light-emitting substrate according to claim 1, wherein the base substrate is further provided with a bonding area, wherein the bonding area comprises a plurality of second pads located above the base substrate, and the plurality of second pads are configured to be in bonding connection to a circuit board; any one of the plurality of second pads comprises: a third metal layer located above the base substrate, and a fourth metal layer located on a side, facing away from the base substrate, of the third metal layer; wherein,
   the third metal layer and the first metal layer are arranged on a same layer, and the fourth metal layer and the second metal layer are arranged on a same layer.

6. The light-emitting substrate according to claim 5, further comprising a first wire layer located between the plurality of first pads and the base substrate, wherein the first wire layer comprises a first metal sub-layer, a first wire sub-layer and a second metal sub-layer that are stacked; wherein,
   the first metal layer and the second metal sub-layer are electrically connected, and the third metal layer and the second metal sub-layer are electrically connected;
   a material of the first metal sub-layer and the second metal sub-layer comprises molybdenum-niobium alloy, and a material of the first wire sub-layer comprises copper.

7. The light-emitting substrate according to claim 6, wherein the light-emitting area further comprises: a first passivation layer located between the first wire layer and the first metal layer, a first planarization layer located between the first passivation layer and the first metal layer, a second planarization layer located on a side, facing away from the base substrate, of the second metal layer, and a first connection portion located on the second metal layer; the second planarization layer covers an area between the plurality of first pads.

8. The light-emitting substrate according to claim 7, wherein the bonding area further comprises: a second passivation layer located between the first wire layer and the third metal layer, a third planarization layer located between the second passivation layer and the third metal layer, a fourth planarization layer located on a side, facing away from the base substrate, of the fourth metal layer, and a second connection portion located on the fourth metal layer; wherein,
the fourth planarization layer covers an area between the plurality of second pads;
the third planarization layer and the first planarization layer are arranged on a same layer, the fourth planarization layer and the second planarization layer are arranged on a same layer, and the second passivation layer and the first passivation layer are arranged on a same layer.

9. The light-emitting substrate according to claim 7, wherein the plurality of first pads are divided into a plurality of groups of first pads, and each group of the plurality of groups of first pads comprises a cathode pad and an anode pad that are arranged in pairs;
the light-emitting substrate further comprises a second wire layer arranged on a same layer as the plurality of first pads, and the second wire layer is configured to realize series connection or parallel connection of the plurality of groups of first pads, and is also electrically connected to the first wire layer through a via hole penetrating the first planarization layer and the first passivation layer.

10. The light-emitting substrate according to claim 5, further comprising a protective layer located on a side, facing away from the base substrate, of the plurality of first pads and the plurality of second pads, wherein the protective layer exposes the plurality of first pads and the plurality of second pads, and a material of the protection layer comprises silicon nitride or silicon oxide.

11. A display device, comprising: a light-emitting substrate, a circuit board, and a plurality of light-emitting units; the light-emitting substrate comprises a base substrate, the base substrate is provided with a light-emitting area, the light-emitting area comprises a plurality of first pads located above the base substrate, and the plurality of first pads are configured to be in bonding connection to the plurality of light-emitting units;
any one of the plurality of first pads comprises: a first metal layer located above the base substrate, and a second metal layer located on a side, facing away from the base substrate, of the first metal layer;
a material of the first metal layer comprises copper, and a material of the second metal layer comprises copper-nickel-titanium alloy;
in at least two cross sections, parallel to a plane where the base substrate is located, of the second metal layer, a quantity of nickel atoms contained per unit area in a cross section farther from the base substrate is greater than a quantity of nickel atoms contained per unit area in another cross section closer to the substrate; and/or a quantity of titanium atoms contained per unit area in the cross section farther from the base substrate is greater than a quantity of titanium atoms contained per unit area in the another cross section closer to the substrate;
the plurality of light-emitting units are electrically connected to the plurality of first pads of the light-emitting substrate, and the circuit board is electrically connected to a plurality of second pads of the light-emitting substrate.

12. The display device according to claim 11, wherein the light-emitting unit is a Mini LED or a Micro LED.

13. The display device according to claim 11, wherein a thickness of the second metal layer is in a range of 30 nm to 100 nm.

14. The display device according to claim 11, wherein, in the material of the second metal layer, a mass fraction of Cu accounts for a range of 90% to 95%, a mass fraction of Ni accounts for a range of 4.5% to 9%, and a mass fraction of Ti accounts for a range of 0.5% to 1%.

15. The display device according to claim 14, wherein the material of the second metal layer further comprises Si or C or O, and a mass fraction of any one of Si, C and O is less than 0.1%.

16. The display device according to claim 11, wherein the base substrate is further provided with a bonding area, the bonding area comprises a plurality of second pads located above the base substrate, and the plurality of second pads are configured to be in bonding connection to the circuit board; any one of the plurality of second pads comprises: a third metal layer located above the base substrate, and a fourth metal layer located on a side, facing away from the base substrate, of the third metal layer; wherein,
the third metal layer and the first metal layer are arranged on a same layer, and the fourth metal layer and the second metal layer are arranged on a same layer.

17. The display device according to claim 16, further comprising a first wire layer located between the plurality of first pads and the base substrate, and the first wire layer comprises a first metal sub-layer, a first wire sub-layer and a second metal sub-layer that are stacked; wherein,
the first metal layer and the second metal sub-layer are electrically connected, and the third metal layer and the second metal sub-layer are electrically connected;
a material of the first metal sub-layer and the second metal sub-layer comprises molybdenum-niobium alloy, and a material of the first wire sub-layer comprises copper.

18. The display device according to claim 17, wherein the light-emitting area further comprises: a first passivation layer located between the first wire layer and the first metal layer, a first planarization layer located between the first passivation layer and the first metal layer, a second planarization layer located on a side, facing away from the base substrate, of the second metal layer, and a first connection portion located on the second metal layer; the second planarization layer covers an area between the plurality of first pads.

19. The display device according to claim 18, wherein the bonding area further comprises: a second passivation layer located between the first wire layer and the third metal layer, a third planarization layer located between the second passivation layer and the third metal layer, a fourth planarization layer located on a side, facing away from the base substrate, of the fourth metal layer, and a second connection portion located on the fourth metal layer; wherein,
the fourth planarization layer covers an area between the plurality of second pads;
the third planarization layer and the first planarization layer are arranged on a same layer, the fourth planarization layer and the second planarization layer are arranged on a same layer, and the second passivation layer and the first passivation layer are arranged on a same layer.

20. The display device according to claim 18, wherein the plurality of first pads are divided into a plurality of groups of first pads, and each group of the plurality of groups of first pads comprises a cathode pad and an anode pad that are arranged in pairs;

the light-emitting substrate further comprises a second wire layer arranged on a same layer as the plurality of first pads, wherein the second wire layer is configured to realize the series connection or parallel connection of the plurality of groups of first pads, and is also electrically connected to the first wire layer through a via hole penetrating the first planarization layer and the first passivation layer.

* * * * *